United States Patent [19]
Blahut et al.

[11] Patent Number: 5,663,756
[45] Date of Patent: Sep. 2, 1997

[54] RESTRICTED ACCESS REMOTE CONTROL UNIT

[75] Inventors: Donald Edgar Blahut, Holmdel, N.J.; Guy Ashley Story, New York, N.Y.; Edward Stanley Szurkowski, Maplewood, N.J.

[73] Assignee: Lucent Technologies Inc., Murray Hill, N.J.

[21] Appl. No.: 567,836

[22] Filed: Dec. 6, 1995

Related U.S. Application Data

[63] Continuation of Ser. No. 247,798, May 23, 1994, abandoned.

[51] Int. Cl.⁶ ............................................. H04N 5/44
[52] U.S. Cl. ................................... 348/5.5; 348/734
[58] Field of Search ............... 348/734, 5.5; 340/825.69, 340/825.56, 825.24, 825.07, 825.31, 825.34, 825.72; 455/6.1, 6.2

[56] References Cited

U.S. PATENT DOCUMENTS

| | | | |
|---|---|---|---|
| 4,626,847 | 12/1986 | Zato | 340/825.24 |
| 4,703,359 | 10/1987 | Rumbolt et al. | 348/734 |
| 4,718,107 | 1/1988 | Hayes | 348/5.5 |
| 4,825,200 | 4/1989 | Evans et al. | 348/734 |
| 4,866,434 | 9/1989 | Keenan | 348/734 |
| 4,912,463 | 3/1990 | Li | 340/825.69 |
| 4,930,158 | 5/1990 | Vogel | 348/5.5 |
| 4,931,790 | 6/1990 | Kobayashi et al. | 340/825.72 |
| 5,033,085 | 7/1991 | Rew | 348/5.5 |
| 5,065,235 | 11/1991 | Iijima | 455/6.1 |
| 5,187,469 | 2/1993 | Evans et al. | 348/734 |

FOREIGN PATENT DOCUMENTS

| | | | |
|---|---|---|---|
| 0348726 A3 | 6/1989 | European Pat. Off. | |
| 0566516A1 | 10/1993 | European Pat. Off. | 359/142 |

*Primary Examiner*—Victor R. Kostak
*Attorney, Agent, or Firm*—Donald P. Dinella

[57] ABSTRACT

A device for restricting access to certain programs. The RCU comprises an entry pad, a controller, a read-only-memory ("ROM"), and an transmission system.

6 Claims, 2 Drawing Sheets

RESTRICTED ACCESS REMOTE CONTROL UNIT

This application is a continuation of application Ser. No. 08/247,798, filed on May 23, 1994, now abandoned.

FIELD OF THE INVENTION

The present invention relates to remote control units ("RCUs"). More specifically, the present invention relates to RCUs that may be used in an interactive television ("ITV") environment.

BACKGROUND OF THE INVENTION

A person in a home may view many different television ("TV") programs. The introduction of cable television ("CATV") has made additional TV programs available for viewing. Now, the next generation of TV, interactive TV ("ITV"), will be available soon. ITV will offer viewers literally hundreds of TV programs from which to choose.

Some TV programs may be appropriate only for certain members of a household. For example, "R" rated movies, while entertaining to some adults, may be inappropriate for children under a certain age to watch.

There have been numerous attempts to successfully restrict access to some TV programs. For example, some systems require a user to enter, e.g., via a remote control unit, an "access code." However, problems may result if one forgets the access code. There is a need for an error free RCU that serves to restrict access to certain programs.

SUMMARY OF THE INVENTION

We have invented an RCU which serves to restrict access to certain programs. Illustratively, the RCU comprises an entry pad, a controller, a read-only-memory ("ROM"), and an transmission system. The ROM contains a first bit code identifying the RCU and a set of bit codes corresponding to RCU functions. Each bit code in the set of bit codes is representative of one or more an entry keys on the entry pad. Each time a sequence of entry keys on the entry pad is depressed, the first bit code is transmitted along with a bit code from the set of bit codes, via the transmission system. The first bit code serves to identify the RCU as one with restricted access to certain programs.

Other objects and advantages of the present invention will become apparent from the brief description of the drawing and the detailed description below.

DETAILED DESCRIPTION

The present invention will be described in an ITV environment. U.S. patent application Ser. No. 07/965,492 entitled "Interactive Television Converter" filed Oct. 23, 1992 and assigned to the assignee of the present invention is incorporated herein by reference as if set forth in its entirety. Also incorporated herein by reference as if set forth in their entirety are: U.S. patent application Ser. No. 08/029205 entitled "Method And Apparatus For The Coding And Display of Overlapping Windows With Transparency" filed Mar. 10, 1993; U.S. patent application Ser. No. 07/965493 entitled "Interactive Television Multicasting" filed Oct. 23, 1992; U.S. patent application Ser. No. 07/965463 entitled "Initializing Terminals In A Signal Distribution System" filed Oct. 23, 1992; U.S. patent application Ser. No. 07/997985 entitled "Program Server For Interactive Television System" filed Dec. 28, 1992; U.S. patent application Ser. No. 08/056973 entitled "Integrated Television Services System" filed May 3, 1993; U.S. patent application Ser. No. 08/056974 entitled "System For Composing Multimedia Signals For Interactive Television Services" filed May 3, 1993; and U.S. patent application Ser. No. 08/175059 entitled "Method Of Controlling Multiple Processes Using Finite State Machines" filed Dec. 29, 1993, all of which are assigned to the assignee of the present invention.

Figure 1:
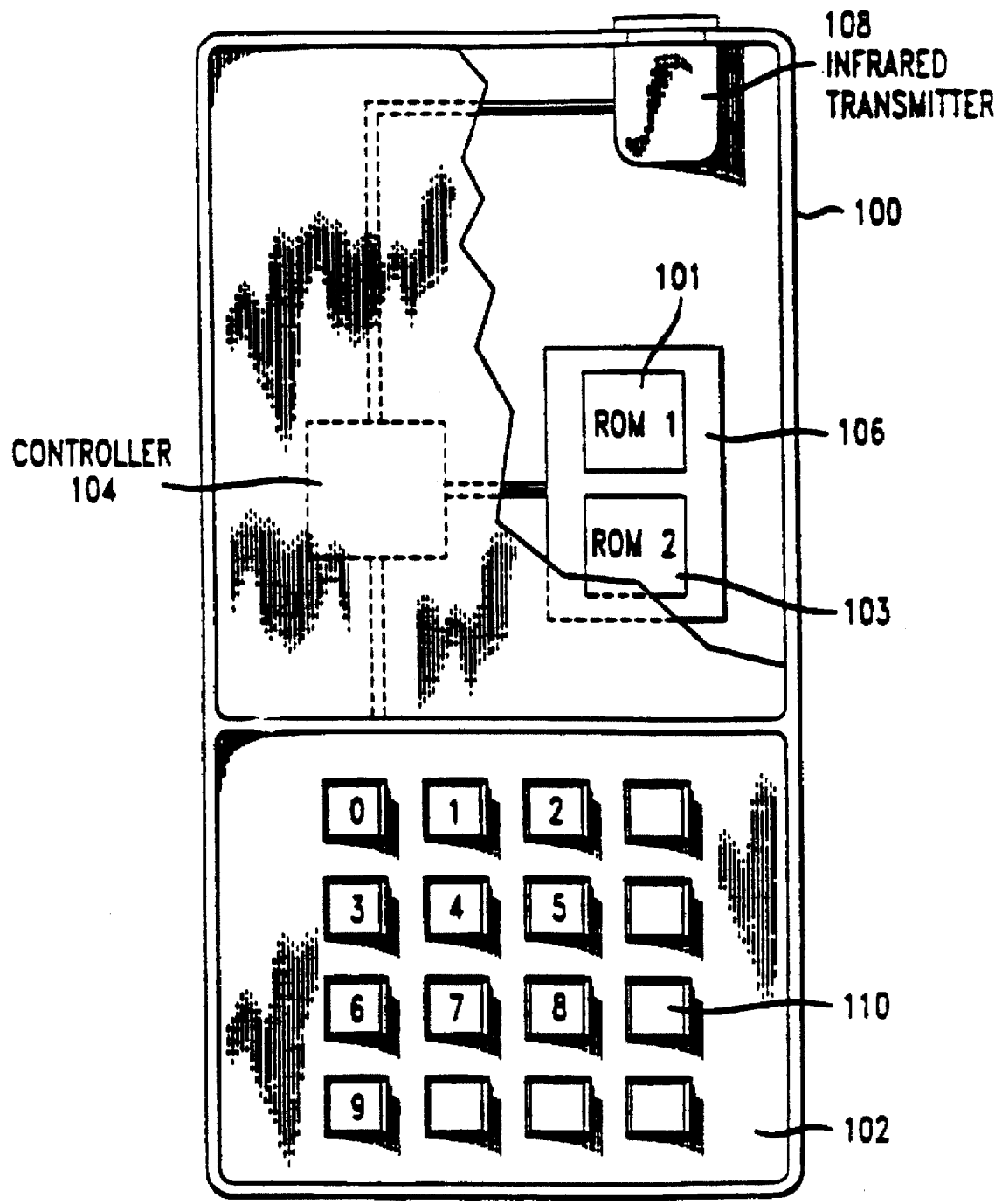
FIG. 1 shows a block diagram of an illustrative RCU made in accordance with the present invention.

Referring to FIG. 1, the RCU 100 comprises an entry pad 102, a controller 104, a read-only-memory ("ROM") 106, and an transmission system 108. These elements are all interconnected as shown.

Still referring to FIG. 1, the entry pad 102 is comprised of a plurality of entry keys. Each entry key, e.g., 110, (or sequence of entry keys) is associated with a bit stream that resides in the ROM 106.

Figure 2:
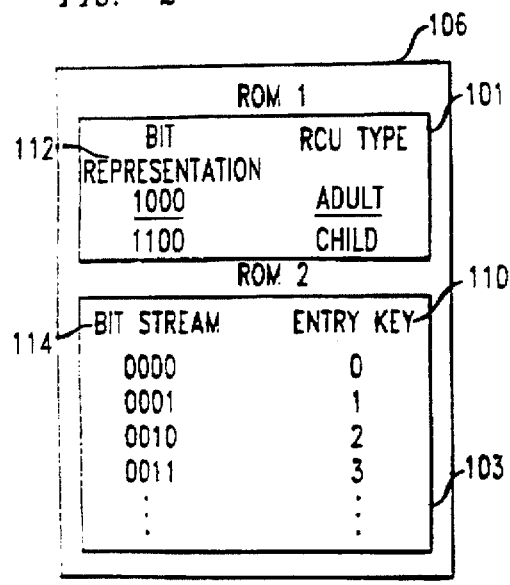
FIG. 2 shows an illustrative arrangement of ROM for the RCU shown in FIG. 1.
Figure 3:
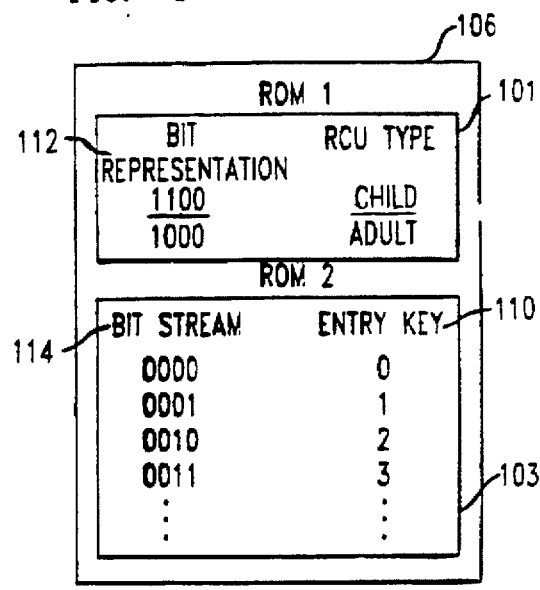
FIG. 3 shows another illustrative arrangement of ROM for the RCU shown in FIG. 1.

Again referring to FIG. 1, the ROM 106 contains a bit stream identifying the particular RCU 100. The ROM 106 also contains a bit stream associated with each entry key on the entry pad 102. Preferably, the ROM 106 is comprised of two ROMs, one 101 associated with the RCU 100 (e.g., ROM1) and one 103 associated with the entry pad 102 (e.g., ROM2). For example, FIG. 2 shows an illustrative arrangement of ROM 106 wherein ROM 101 (e.g., ROM 1) contains a bit representation of access capabilities 112 which identifies the particular RCU 100 as an "adult" RCU type, and ROM 103 (e.g., ROM 2) contains bit streams 114 which are identified with particular entry keys 110. Alternatively, FIG. 3 shows another illustrative arrangement of ROM 106 wherein ROM 101 contains the bit representation of access capabilities 112 which identifie the particular RCU 100 as a "child" RCU type, and ROM 103 contains bit streams 114 which are identified with particular entry keys 110.

Again referring to FIG. 1, the controller 104 receives a signal that an entry key has been depressed. The controller 104 looks up the first bit stream in a first ROM (identifying the RCU 100) and a bit stream in the set of bit streams in a second ROM associated with the depressed entry key. The controller 104 then communicates these bit streams to the transmission system.

Again referring to FIG. 1, the transmission system 108 is preferably an infrared transmitter. The transmission system 108 transmits, in an ITV environment, a bit stream to, for example a set top box. The set top box permits programs to be viewed only if the programs are allowable based on the first bit stream that indicates the type of RCU being used. In other words, only certain RCUs (with predetermined first bit streams) may access certain programs. In this way, a remote control unit for children may allow access only to certain programs.

Although the invention has been described with respect to an ITV environment, those skilled in the art will realize that the present invention may be used in other environments such as the cable television environment.

Figure 4:
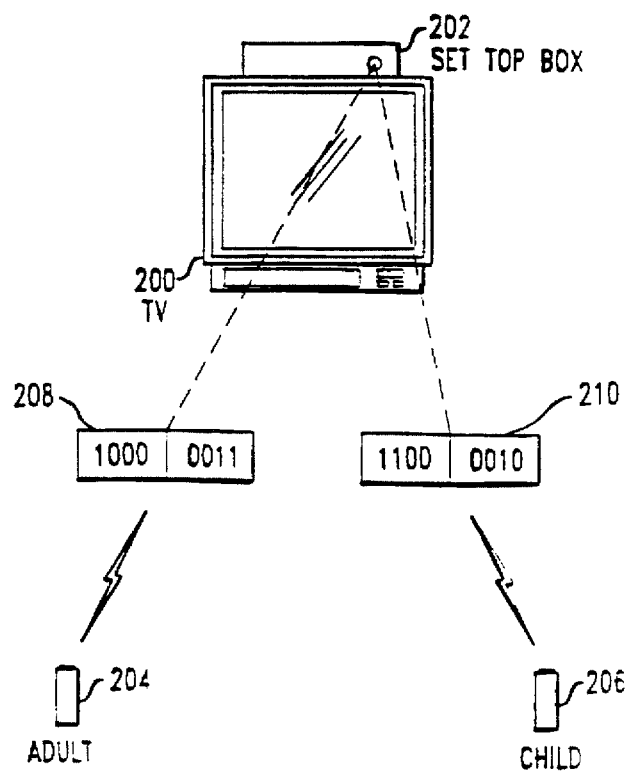
FIG. 4 shows an illustrative remote control transmission system employing a plurality of RCU's of the type shown in FIG. 1.

Further, those skilled in the art realize that, in various embodiments, the intelligence for effectuating the present invention may be in the cable company's headend or may reside locally, such as in a set top box. For example, FIG. 4 shows an illustrative remote control transmission system used in the cable television arrangement mentioned previously. In such a system, a plurality of RCU's (e.g., adult 204 and child 206) communicate with a set top box 202 connected to television set 200. Thus, in accordance with the present invention, access to certain programs from the cable television provider to particular users may be limited as RCU 204 and RCU 206 communicate, via bit streams 208 and 210 respectively, with set box 202 in the control of television 200. Finally, the intelligence may reside in the RCU 100 itself. In the latter case, the RCU 100 could be programmed so as to simply not communicate a command to the television set to turn on channel 68 which is, illustratively, an adult movie channel or a channel by which one is able to order items and have it billed to their ITV account.

What we claim is:

1. A remote control unit comprising:
   (a) an entry pad comprising a plurality of entry keys;
   (b) a controller responsive to the entry pad;
   (c) a memory device for storing:
      (i) a bit representation corresponding to a set of access capabilities of the remote control unit, the set of access capabilities being one of at least two different sets of access capabilities under which a particular remote controlled device can operate; and
      (ii) a plurality of bit streams, each bit stream of the plurality of bit streams corresponding to a sequence of at least one entry key from the plurality of keys;
   (d) means, responsive to the controller, for transmitting the bit representation corresponding to the one set of access capabilities of the remote control unit.

2. The remote control unit of claim 1 wherein the memory device for storing comprises a read only memory circuit.

3. The remote control unit of claim 1 wherein the means, responsive to the controller, for transmitting comprises an infrared transmitter.

4. A remote control transmission system comprising:
   a remote controlled device;
   a plurality of remote control units, each of the remote control units storing respective bit representations corresponding to different sets of access capabilities under which the remote controlled device may operate; and
   a receiver in the remote controlled device for receiving the bit representation from each of the remote control units, the remote controlled device being responsive to receipt of the bit representation to operate under the corresponding set of access capabilities.

5. A remote control transmission system comprising:
   a remote controlled device;
   a first remote control unit having a bit representation corresponding to a first set of access capabilities under which the remote controlled device can operate;
   a second remote control unit having a bit representation corresponding to a second set of access capabilities under which the remote controlled device can operate, the second set of access capabilities being different from the first set of access capabilities; and
   a receiver in the remote controlled device for receiving the bit representation when transmitted by either the first remote control unit or the second remote control unit to the remote controlled device, the remote controlled device being responsive to the bit representation to operate under the corresponding set of access capabilities.

6. The remote control transmission system of claim 4 wherein each remote control unit further comprises:
   an entry pad comprising a plurality of entry keys;
   a controller responsive to the entry pad;
   a memory device for storing a plurality of bit streams, each bit stream of the plurality of bit streams corresponding to a sequence of at least one entry key from the plurality of keys;
   means, responsive to the controller, for transmitting the bit representation and the plurality of bit streams to the receiver in the remote controlled device.

* * * * *